US012130313B2

(12) United States Patent
Xu et al.

(10) Patent No.: US 12,130,313 B2
(45) Date of Patent: Oct. 29, 2024

(54) SYSTEM AND METHOD FOR VERIFYING ALTERNATING CURRENT (AC)/DIRECT CURRENT (DC) CONVERSION OF ULTRALOW-FREQUENCY VOLTAGE BASED ON QUANTUM TECHNOLOGY

(71) Applicants: State Grid Jiangsu Electric Power Co., Ltd. Marketing Service Center, Jiangsu (CN); National Institute of Metrology, China, Beijing (CN)

(72) Inventors: Qing Xu, Jiangsu (CN); Zhaomin Shi, Beijing (CN); Xianlin Pan, Beijing (CN); Ying Song, Beijing (CN); Tiandi Zhou, Beijing (CN); Meimei Duan, Jiangsu (CN); Zhengqi Tian, Jiangsu (CN); Shuangshuang Zhao, Jiangsu (CN)

(73) Assignees: State Grid Jiangsu Electric Power Co., Ltd. Marketing Service Center, Nanjing (CN); National Institute of Metrology, China, Beijing (CN)

( * ) Notice: Subject to any disclaimer, the term of this patent is extended or adjusted under 35 U.S.C. 154(b) by 0 days.

(21) Appl. No.: 17/788,291

(22) PCT Filed: Apr. 24, 2022

(86) PCT No.: PCT/CN2022/088663
§ 371 (c)(1),
(2) Date: Jun. 23, 2022

(87) PCT Pub. No.: WO2023/040264
PCT Pub. Date: Mar. 23, 2023

(65) Prior Publication Data
US 2024/0168066 A1 May 23, 2024

(30) Foreign Application Priority Data
Sep. 14, 2021 (CN) .......................... 202111073057.0

(51) Int. Cl.
*G01R 19/22* (2006.01)
*G01R 19/25* (2006.01)
(Continued)

(52) U.S. Cl.
CPC ......... *G01R 19/22* (2013.01); *G01R 19/2509* (2013.01); *G01R 19/225* (2013.01); *G01R 35/007* (2013.01); *G01R 35/02* (2013.01)

(58) Field of Classification Search
CPC .... G01R 35/007; G01R 19/225; G01R 35/02; G01R 19/22; G01R 19/2509
See application file for complete search history.

(56) References Cited

U.S. PATENT DOCUMENTS
2020/0373475 A1* 11/2020 Rufenacht ............ H10N 60/805

FOREIGN PATENT DOCUMENTS
CN 111537932 A 8/2020
CN 112162231 A 1/2021

OTHER PUBLICATIONS

Amagai et al. ("Low-Frequency Characterization in Thermal Converters Using AC-Programmable Josephson Voltage Standard System," in IEEE Transactions on Instrumentation and Measurement, vol. 62, No. 6, pp. 1621-1626, Jun. 2013, doi: 10.1109/TIM.2013.2245182.) (Year: 2013).*

* cited by examiner

*Primary Examiner* — Manish S Shah
*Assistant Examiner* — Christian T Bryant

(57) ABSTRACT

The present disclosure provides a system and method for verifying alternating current (AC)/direct current (DC) conversion of an ultralow-frequency voltage. The system includes a quantum voltage generation system, a low-frequency signal source, a follower, three switches, a double-heater-strip thermoelectric converter, a nanovoltmeter, a (Continued)

clock source, a high-precision digital sampling system, and an upper computer. Based on DC and AC quantum voltage technologies and with reference to the double-heater-strip thermoelectric converter, an ultralow-frequency voltage is traced to a DC quantum voltage through AC/DC conversion, and a conversion result is compared with an AC quantum voltage to verify rationality of precision and an uncertainty evaluation result of AC/DC conversion of the ultralow-frequency voltage, so as to ensure reliability of AC/DC conversion of the ultralow-frequency voltage. This resolves a problem that the AC/DC conversion result of the ultralow-frequency voltage cannot be verified.

8 Claims, 1 Drawing Sheet

(51) Int. Cl.
*G01R 35/02* (2006.01)
*G01R 35/00* (2006.01)

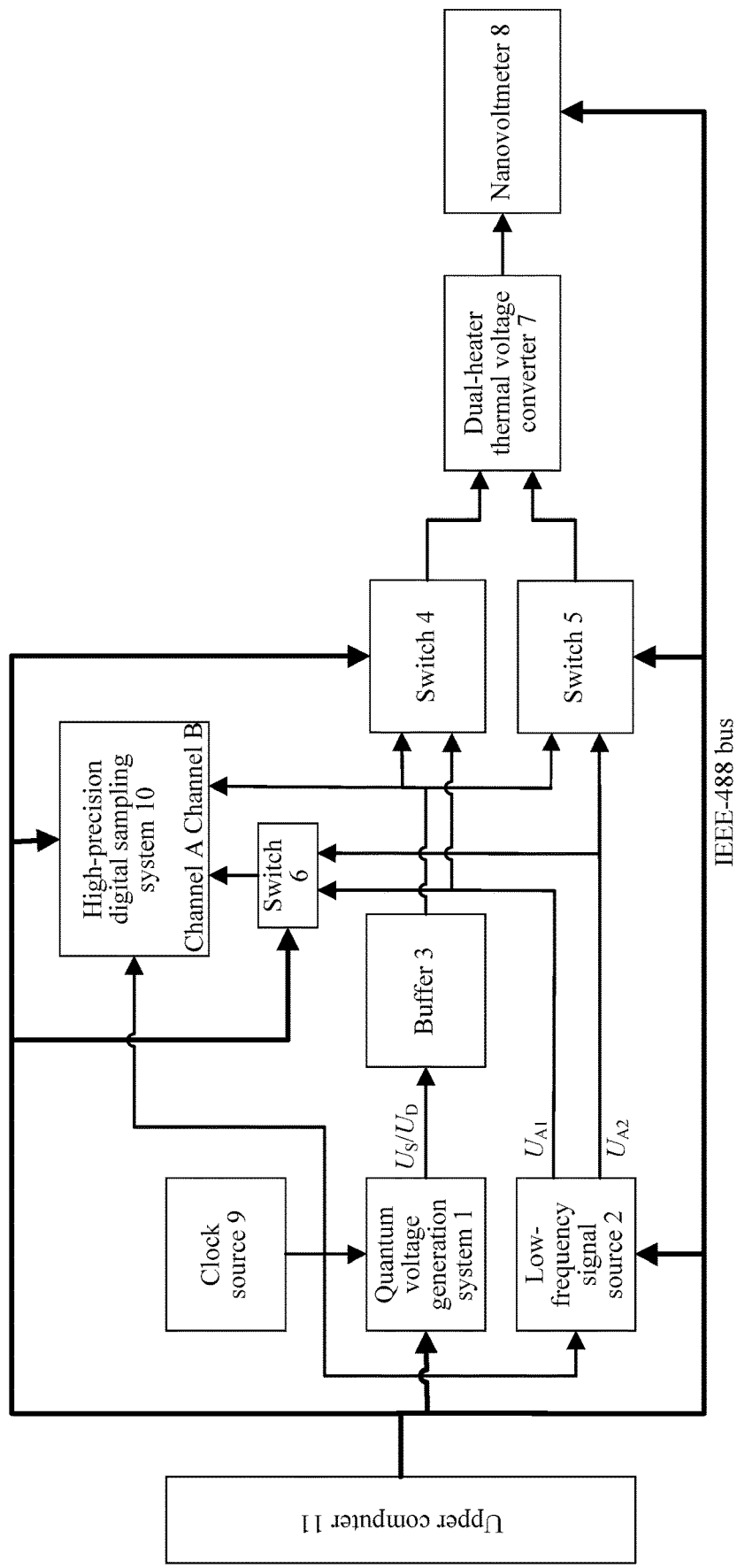

SYSTEM AND METHOD FOR VERIFYING ALTERNATING CURRENT (AC)/DIRECT CURRENT (DC) CONVERSION OF ULTRALOW-FREQUENCY VOLTAGE BASED ON QUANTUM TECHNOLOGY

TECHNICAL FIELD

The present disclosure relates to the field of alternating current (AC) voltage measurement, and particularly relates to a system and method for verifying alternating current (AC)/direct current (DC) conversion of an ultralow-frequency voltage based on a quantum technology.

BACKGROUND

Precise measurement of an ultralow-frequency voltage signal is widely used in vibration signal measurement, research on power battery measurement of a new energy vehicle, high-voltage testing, and other fields. An upper frequency limit of a vibration signal generally does not exceed 10 Hz, and is even in an order of mHz for some vibration signals. A low-frequency vibration signal is often converted into an electrical signal by a vibration sensor for measurement. AC impedance spectroscopy test method has attracted more and more attention in research on measurement of a lithium-ion power battery of the new energy vehicle. In the research, it is difficult to ensure accuracy of an ultralow frequency, so it is necessary to establish an ultralow-frequency voltage standard. In addition, an ultralow-frequency voltage technology also has a wide application prospect in high-voltage testing. Using a 0.1 Hz ultralow-frequency voltage instead of a 50 Hz power frequency voltage in high-voltage testing has obvious advantages and practical value. Therefore, establishing a national ultralow-frequency voltage benchmark to realize quantity traceability of an ultralow-frequency voltage is of great significance to promoting the development of industries such as precision measurement of the low-frequency vibration signals, testing and measurement of the lithium-ion power battery, as well as high-voltage testing.

The quantity traceability of the ultralow-frequency voltage is realized through AC/DC conversion by using a double-heater-strip thermoelectric converter as a reference standard, to trace the ultralow-frequency voltage to a DC voltage reference. At present, there is still a lack of a method for verifying precision of AC/DC conversion of the ultralow-frequency voltage, which makes it impossible to verify rationality of an uncertainty evaluation result of AC/DC conversion realized by the double-heater-strip thermoelectric converter for the ultralow-frequency voltage. With the continuous development of superconducting quantum technologies, a synthesized AC quantum voltage has been realized. The Programmable Josephson Voltage Standard (PJVS) with high amplitude accuracy has been successfully synthesized. With reference to a quantum voltage technology, the present disclosure provides a system and method for verifying AC/DC conversion of an ultralow-frequency voltage.

SUMMARY

To resolve the problem in the prior art, the present disclosure provides a system and method for verifying AC/DC conversion of an ultralow-frequency voltage based on a quantum technology, to verify rationality of precision and an uncertainty evaluation result of AC/DC conversion realized by double-heater-strip thermoelectric converter for an ultralow-frequency voltage, so as to ensure reliability of AC/DC conversion of the ultralow-frequency voltage.

The present disclosure is achieved by the following technical solutions:

A system for verifying AC/DC conversion of an ultralow-frequency voltage based on a quantum technology includes a quantum voltage generation system, a low-frequency signal source, a follower, a first switch, a second switch, a third switch, a double-heater-strip thermoelectric converter, a nanovoltmeter, a clock source, a high-precision digital sampling system, and an upper computer, where the quantum voltage generation system is separately connected to the first switch, the second switch, and a channel B of the high-precision digital sampling system by using the follower, the low-frequency signal source is connected to the first switch, the second switch, and the third switch, the third switch is connected to a channel A of the high-precision digital sampling system, the first switch and the second switch are connected to the double-heater-strip thermoelectric converter, the double-heater-strip thermoelectric converter is connected to the nanovoltmeter, the clock source is connected to the quantum voltage generation system, the low-frequency signal source, and the high-precision digital sampling system, and the upper computer is connected to the quantum voltage generation system, the low-frequency signal source, the first switch, the second switch, the third switch, the nanovoltmeter, and the high-precision digital sampling system by using an IEEE-488 bus;

the quantum voltage generation system provides an AC quantum voltage $U_S$ and a DC quantum voltage $U_D$;

the low-frequency signal source provides two equal-amplitude and orthogonal low-frequency voltage signals $U_{A1}$ and $UA_2$;

the follower is configured to improve a load capacity of a quantum voltage system;

the first switch and the second switch are used to control switching between a low-frequency voltage signal and DC quantum voltage at the input terminal of the dual-heater thermal voltage converter;

the third switch is used to control switching between the two low-frequency voltage signals $U_{A1}$ and $U_{A2}$ connected to the channel A of the high-precision digital sampling system;

the double-heater-strip thermoelectric converter is configured to realize equivalent conversion between the low-frequency voltage signals $U_{A1}$ and $U_{A2}$ and the DC quantum voltage;

the nanovoltmeter is configured to read thermoelectric potentials output by the double-heater-strip thermoelectric converter in AC and DC states;

the clock source provides a synchronous clock signal to realize synchronous output of the quantum voltage generation system and the low-frequency signal source, as well as synchronous measurement of the high-precision digital sampling system;

the high-precision digital sampling system is configured to precisely measure a difference between the AC quantum voltage and the low-frequency voltage signal; and the upper computer is configured to control the whole system to realize automatic measurement.

A method for verifying AC/DC conversion of an ultralow-frequency voltage based on a quantum technology includes the following steps:

A. controlling, by an upper computer, a third switch to perform switching so as to connect a $U_{A1}$ branch to a channel A of a high-precision digital sampling system;

B. controlling, by the upper computer, a quantum voltage generation system to output an AC quantum voltage signal $U_S$ that is input to a channel B of the high-precision digital sampling system by using a follower 3, and controlling a low-frequency signal source to output two equal-amplitude and orthogonal low-frequency voltage signals $U_{A1}$ and $U_{A2}$, where nominal values of $U_{A1}$, $U_{A2}$, and $U_S$ are equal;

C. controlling, by the upper computer, a first switch and a second switch to perform switching, so as to input the low-frequency voltage signals $U_{A1}$ and $U_{A2}$ to a double-heater-strip thermoelectric converter;

D. reading, by using a nanovoltmeter, a thermoelectric potential $E_{A1}$ output by the double-heater-strip thermoelectric converter;

E. measuring, by using the high-precision digital sampling system, a relative error $\Delta_1$ between the low-frequency voltage signal $U_{A1}$ and the AC quantum voltage signal $U_S$;

F. controlling, by the upper computer, the quantum voltage generation system to output a positive DC quantum voltage signal $U_{D+}$, where a nominal value of $U_{D+}$ is equal to that of the AC quantum voltage signal $U_S$;

G. controlling, by the upper computer, the first switch and the second switch to perform switching, so as to input the positive DC quantum voltage signal $U_{D+}$ to the double-heater-strip thermoelectric converter;

H. reading, by using the nanovoltmeter, a thermoelectric potential $E_{D+}$ output by the double-heater-strip thermoelectric converter;

I. controlling, by the upper computer, the quantum voltage generation system to output a negative DC quantum voltage signal $U_{D-}$, where an amplitude of $U_{D-}$ is equal to that of $U_{D+}$;

J. reading, by using the nanovoltmeter, a thermoelectric potential $E_{D-}$ output by the double-heater-strip thermoelectric converter;

K. controlling, by the upper computer, the quantum voltage generation system to output again the AC quantum voltage signal $U_S$ that is input to the channel B of the high-precision digital sampling system by using the follower, and controlling the first switch and the second switch to perform switching, so as to input again the low-frequency voltage signals $U_{A1}$ and $U_{A2}$ to the double-heater-strip thermoelectric converter;

L. reading, by using the nanovoltmeter, a thermoelectric potential $E_{A2}$ output by the double-heater-strip thermoelectric converter;

M. measuring, by using the high-precision digital sampling system, a relative error $\Delta_2$ between the low-frequency voltage signal $U_{A1}$ and the AC quantum voltage signal $U_S$;

N. performing AC/DC conversion to obtain a valid value $U_1$ of an ultralow-frequency voltage signal, where the valid value $U_1$ may be represented as:

$$U_1 = \frac{(U_{D+} - U_{D-})}{2} \times \left[1 + \frac{E_{A1} + E_{A2} - (E_{D+} + E_{D-})}{2(E_{D+} + E_{D-})}\right]; \quad (1)$$

and
the low-frequency signal $U_{A1}$ output by the low-frequency signal source may be represented as:

$$U_{A1} = U_S \times \left[1 + \frac{\Delta_1 + \Delta_2}{2}\right] \quad (2)$$

O. controlling, by the upper computer, the third switch to perform switching so as to connect a $U_{A2}$ branch to the channel A of the high-precision digital sampling system, repeating steps B to M, and performing AC/DC conversion to obtain a valid value $U_2$ of the ultralow-frequency voltage signal, where the valid value $U_2$ may be represented as:

$$U_2 = \frac{(U_{D+} - U_{D-})}{2} \times \left[1 + \frac{E_{A1} + E_{A2} - (E_{D+} + E_{D-})}{2(E_{D+} + E_{D-})}\right]; \quad (3)$$

and
the low-frequency signal $U_{A2}$ output by the low-frequency signal source may be represented as:

$$U_{A2} = U_S \times \left[1 + \frac{\Delta_1 + \Delta_2}{2}\right]; \quad (4)$$

and
P. defining $$U_- = \frac{U_1 + U_2}{2} \text{ and } U_A = \frac{U_{A1} + U_{A2}}{2},$$

such that a relative error between an AC/DC conversion result of an ultralow-frequency voltage and the AC quantum voltage may be represented as:

$$\Delta = \frac{U_- - U_A}{U_A}. \quad (5)$$

The foregoing method can realize mutual verification between AC/DC conversion of the ultralow-frequency voltage and the AC quantum voltage.

Compared with the prior art, the present disclosure provides a system and method for verifying AC/DC conversion of an ultralow-frequency voltage based on a quantum technology, to realize mutual verification between an AC quantum voltage and AC/DC conversion of an ultralow-frequency voltage. With reference to a DC quantum voltage technology, the ultralow-frequency voltage is traced to a DC quantum voltage through AC/DC conversion, and a conversion result is compared with the AC quantum voltage to verify rationality of precision and an uncertainty evaluation result of AC/DC conversion of the ultralow-frequency voltage, so as to ensure reliability of AC/DC conversion of the ultralow-frequency voltage. This resolves a problem that the AC/DC conversion result of the ultralow-frequency voltage cannot be verified.

BRIEF DESCRIPTION OF THE DRAWINGS

FIG. 1 is a block diagram of a system for verifying alternating current (AC)/direct current (DC) conversion of an ultralow-frequency voltage based on a quantum technology.

Reference numerals: quantum voltage generation system 1, low-frequency signal source 2, follower 3, switch 4, switch 5, switch 6, double-heater-strip thermoelectric converter 7, nanovoltmeter 8, clock source 9, high-precision digital sampling system 10, and upper computer 11.

DETAILED DESCRIPTION

The following describes the present disclosure in more detail with reference to the accompanying drawings and embodiments.

A system for verifying AC/DC conversion of an ultralow-frequency voltage based on a quantum technology is composed of a quantum voltage generation system 1, a low-frequency signal source 2, a follower 3, a switch 4, a switch 5, a switch 6, a double-heater-strip thermoelectric converter 7, a nanovoltmeter 8, a clock source 9, a high-precision digital sampling system 10, and an upper computer 11. The switch 4 is a first switch, the switch 5 is a second switch, and the switch 6 is a third switch. The quantum voltage generation system 1 is separately connected to the switch 4, the switch 5, and a channel B of the high-precision digital sampling system 10 by using the follower 3, the low-frequency signal source 2 is connected to the switch 4, the switch 5, and the switch 6, the switch 6 is connected to a channel A of the high-precision digital sampling system 10, the switch 4 and the switch 5 are connected to the double-heater-strip thermoelectric converter 7, the double-heater-strip thermoelectric converter 7 is connected to the nanovoltmeter 8, the clock source 9 is connected to the quantum voltage generation system 1, the low-frequency signal source 2, and the high-precision digital sampling system 10, and the upper computer 11 is connected to the quantum voltage generation system 1, the low-frequency signal source 2, the switch 4, the switch 5, the switch 6, the nanovoltmeter 8, and the high-precision digital sampling system 10 to realize automatic control of the system.

The quantum voltage generation system 1 provides an AC quantum voltage $U_S$ and a DC quantum voltage $U_D$.

The low-frequency signal source provides two equal-amplitude and orthogonal low-frequency voltage signals $U_{A1}$ and $U_{A2}$.

The follower 3 is configured to improve a load capacity of a quantum voltage system.

The switch 4 and the switch 5 are configured to control switching between a low-frequency voltage signal at input terminal of the double-heater-strip thermoelectric converter 7 and the DC quantum voltage.

The switch 6 is used to control switching between the two low-frequency voltage signals $U_{A1}$ and $U_{A2}$ connected to the channel A of the high-precision digital sampling system 10.

The double-heater-strip thermoelectric converter 7 is configured to realize equivalent conversion between the low-frequency voltage signals $U_{A1}$ and $U_{A2}$ and the DC quantum voltage.

The nanovoltmeter 8 is configured to read thermoelectric potentials output by the double-heater-strip thermoelectric converter 7 in AC and DC states.

The clock source 9 provides a synchronous clock signal to realize synchronous output of the quantum voltage generation system 1 and the low-frequency signal source 2, as well as synchronous measurement of the high-precision digital sampling system 10.

The high-precision digital sampling system 10 is configured to precisely measure a difference between the AC quantum voltage and the low-frequency voltage signal.

The upper computer 11 is configured to control the whole system to realize automatic measurement.

The following describes, by using an ultralow-frequency voltage with an amplitude of 1 V and a frequency of 0.1 Hz as an example, a method for verifying AC/DC conversion of an ultralow-frequency voltage based on a quantum technology.

A. An upper computer 11 controls a switch 6 to perform switching so as to connect a $U_{A1}$ branch to a channel A of a high-precision digital sampling system 10.

B. The upper computer 11 controls a quantum voltage generation system 1 to output an AC quantum voltage signal $U_S$ with an amplitude of 1 V and a frequency of 0.1 Hz, where the AC quantum voltage signal $U_S$ is input to a channel B of the high-precision digital sampling system 10 by using a follower 3, and controls a low-frequency signal source 2 to output two orthogonal low-frequency voltage signals $U_{A1}$ and $U_{A2}$ with an amplitude of 1 V and a frequency of 0.1 Hz.

C. The upper computer 11 controls a switch 4 and a switch 5 to perform switching, so as to input the low-frequency voltage signals $U_{A1}$ and $U_{A2}$ to a double-heater-strip thermoelectric converter 7.

D. Read, by using a nanovoltmeter 8, a thermoelectric potential $E_{A1}$ output by the double-heater-strip thermoelectric converter.

E. Measure, by using the high-precision digital sampling system 10, a relative error $\Delta_1$ between the low-frequency voltage signal $U_{A1}$ and the AC quantum voltage signal $U_S$.

F. The upper computer 11 controls the quantum voltage generation system 1 to output a positive DC quantum voltage signal $U_{D+}$ with an amplitude of 1 V.

G. The upper computer 11 controls the switch 4 and the switch 5 to perform switching, so as to input the positive DC quantum voltage signal $U_{D+}$ to the double-heater-strip thermoelectric converter 7.

H. Read, by using the nanovoltmeter 8, a thermoelectric potential $E_{D+}$ output by the double-heater-strip thermoelectric converter.

I. The upper computer 11 controls the quantum voltage generation system 1 to output a negative DC quantum voltage signal $U_{D-}$ with an amplitude of 1 V.

J. Read, by using the nanovoltmeter 8, a thermoelectric potential $E_{D-}$ output by the double-heater-strip thermoelectric converter.

K. The upper computer 11 controls the quantum voltage generation system 1 to output again the AC quantum voltage signal $U_S$ with the amplitude of 1 V and the frequency of 0.1 Hz, where the AC quantum voltage signal $U_S$ is input to the channel B of the high-precision digital sampling system 10 by using the follower 3, and controls the switch 4 and the switch 5 to perform switching, so as to input again the low-frequency voltage signals $U_{A1}$ and $U_{A2}$ to the double-heater-strip thermoelectric converter 7.

L. Read, by using the nanovoltmeter 8, a thermoelectric potential $E_{A2}$ output by the double-heater-strip thermoelectric converter 7.

M. Measure, by using the high-precision digital sampling system 10, a relative error $\Delta_2$ between the low-frequency voltage signal $U_{A1}$ and the AC quantum voltage signal $U_S$.

N. Perform AC/DC conversion to obtain a valid value $U_1$ of an ultralow-frequency voltage signal, where the valid value $U_1$ may be represented as:

$$U_1 = \frac{(U_{D+} - U_{D-})}{2} \times \left[1 + \frac{E_{A1} + E_{A2} - (E_{D+} + E_{D-})}{2(E_{D+} + E_{D-})}\right]; \tag{1}$$

and the low-frequency signal $U_{A1}$ output by the low-frequency signal source 2 may be represented as:

$$U_{A1} = U_S \times \left[1 + \frac{\Delta_1 + \Delta_2}{2}\right] \quad (2)$$

O. The upper computer 11 controls the switch 6 to perform switching so as to connect a $U_{A2}$ branch to the channel A of the high-precision digital sampling system 10, repeats B to M, and performs AC/DC conversion to obtain a valid value $U_2$ of the ultralow-frequency voltage signal, where the valid value $U_2$ may be represented as:

$$U_2 = \frac{(U_{D+} - U_{D-})}{2} \times \left[1 + \frac{E_{A1} + E_{A2} - (E_{D+} + E_{D-})}{2(E_{D+} + E_{D-})}\right]; \quad (3)$$

and the low-frequency signal $U_{A2}$ output by the low-frequency signal source 2 may be represented as:

$$U_{A2} = U_S \times \left[1 + \frac{\Delta_1 + \Delta_2}{2}\right] \quad (4)$$

P. Define $$U_- = \frac{U_1 + U_2}{2} \text{ and } U_A = \frac{U_{A1} + U_{A2}}{2},$$

such that a relative error between an AC/DC conversion result of the ultralow-frequency voltage and the AC quantum voltage may be represented as:

$$\Delta = \frac{U_- - U_A}{U_A}. \quad (5)$$

The foregoing process can realize mutual verification between AC/DC conversion of the ultralow-frequency voltage with the amplitude of 1 V and the frequency of 0.1 Hz and the AC quantum voltage.

The above described are merely preferred embodiments of the present disclosure, and are not intended to limit the present disclosure. Any modification, equivalent substitution, and improvement without departing from the spirit and principle of the present disclosure shall be included within the protection scope of the present disclosure.

The invention claimed is:

1. A system for verifying alternating current (AC)/direct current (DC) conversion of an ultralow-frequency voltage based on a quantum technology, wherein the system comprises a quantum voltage generation system (1), a low-frequency signal source (2), a follower (3), a first switch (4), a second switch (5), a third switch (6), a double-heater-strip thermoelectric converter (7), a nanovoltmeter (8), a clock source (9), a high-precision digital sampling system (10), and an upper computer (11), wherein the quantum voltage generation system (1) is separately connected to the first switch (4), the second switch (5), and a channel B of the high-precision digital sampling system (10) by using the follower (3), the low-frequency signal source (2) is connected to the first switch (4), the second switch (5), and the third switch (6), the third switch (6) is connected to a channel A of the high-precision digital sampling system (10), the first switch (4) and the second switch (5) are connected to the double-heater-strip thermoelectric converter (7), the double-heater-strip thermoelectric converter (7) is connected to the nanovoltmeter (8), the clock source (9) is connected to the quantum voltage generation system (1), the low-frequency signal source (2), and the high-precision digital sampling system (10), and the upper computer (11) is connected to the quantum voltage generation system (1), the low-frequency signal source (2), the first switch (4), the second switch (5), the third switch (6), the nanovoltmeter (8), and the high-precision digital sampling system (10); the quantum voltage generation system (1) provides an AC quantum voltage $U_S$ and a DC quantum voltage $U_D$; the low-frequency signal source (2) provides two equal-amplitude and orthogonal low-frequency voltage signals $U_{A1}$ and $U_{A2}$; the follower (3) is configured to improve a load capacity of a quantum voltage system; the first switch (4) and the second switch (5) are used to control switching between a low-frequency voltage signal and DC quantum voltage at the input terminal of the dual-heater thermal voltage converter (7); the third switch (6) is used to control switching between the two low-frequency voltage signals $U_{A1}$ and $U_{A2}$ connected to the channel A of the high-precision digital sampling system (10); the double-heater-strip thermoelectric converter (7) is configured to realize equivalent conversion between the low-frequency voltage signals $U_{A1}$ and $U_{A2}$ and the DC quantum voltage; the nanovoltmeter (8) is configured to read thermoelectric potentials output by the double-heater-strip thermoelectric converter (7) in AC and DC states; the clock source (9) provides a synchronous clock signal to realize synchronous output of the quantum voltage generation system (1) and the low-frequency signal source (2), as well as synchronous measurement of the high-precision digital sampling system (10); the high-precision digital sampling system (10) is configured to precisely measure a difference between the AC quantum voltage and the low-frequency voltage signal; and the upper computer (11) is configured to control the whole system to realize automatic measurement.

2. The system for verifying AC/DC conversion of an ultralow-frequency voltage based on a quantum technology according to claim 1, wherein the upper computer (11) is connected to the quantum voltage generation system (1), the low-frequency signal source (2), the first switch (4), the second switch (5), the third switch (6), the nanovoltmeter (8), and the high-precision digital sampling system (10) by using an IEEE-488 bus.

3. A method for verifying AC/DC conversion of an ultralow-frequency voltage based on the system for verifying AC/DC conversion of an ultralow-frequency voltage based on a quantum technology according to claim 2, wherein the method comprises the following steps:

A. controlling, by the upper computer (11), the third switch (6) to perform switching so as to connect a $U_{A1}$ branch to the channel A of the high-precision digital sampling system (10);

B. controlling, by the upper computer (11), the quantum voltage generation system (1) to output an AC quantum voltage signal $U_S$ that is input to the channel B of the high-precision digital sampling system (10) by using the follower (3), and controlling the low-frequency signal source (2) to output two equal-amplitude and orthogonal low-frequency voltage signals $U_{A1}$ and $U_{A2}$, wherein nominal values of $U_{A1}$, $U_{A2}$, and $U_S$ are equal;

C. controlling, by the upper computer (11), the first switch (4) and the second switch (5) to perform switching, so as to input the low-frequency voltage signals $U_{A1}$ and $U_{A2}$ to the double-heater-strip thermoelectric converter (7);

D. reading, by using the nanovoltmeter (8), a thermoelectric potential $E_{A1}$ output by the double-heater-strip thermoelectric converter (7);

E. measuring, by using the high-precision digital sampling system (10), a relative error $\Delta_1$ between the low-frequency voltage signal $U_{A1}$ and the AC quantum voltage signal $U_S$;

F. controlling, by the upper computer (11), the quantum voltage generation system (1) to output a positive DC quantum voltage signal $U_{D+}$, wherein a nominal value of $U_{D+}$ is equal to that of the AC quantum voltage signal $U_S$;

G. controlling, by the upper computer (11), the first switch (4) and the second switch (5) to perform switching, so as to input the positive DC quantum voltage signal $U_{D+}$ to the double-heater-strip thermoelectric converter (7);

H. reading, by using the nanovoltmeter (8), a thermoelectric potential $E_{D+}$ output by the double-heater-strip thermoelectric converter (7);

I. controlling, by the upper computer (11), the quantum voltage generation system (1) to output a negative DC quantum voltage signal $U_{D-}$, wherein an amplitude of $U_{D-}$ is equal to that of $U_{D+}$;

J. reading, by using the nanovoltmeter (8), a thermoelectric potential $E_{D-}$ output by the double-heater-strip thermoelectric converter (7);

K. controlling, by the upper computer (11), the quantum voltage generation system (1) to output again the AC quantum voltage signal $U_S$ that is input to the channel B of the high-precision digital sampling system (10) by using the follower (3), and controlling the first switch (4) and the second switch (5) to perform switching, so as to input again the low-frequency voltage signals $U_{A1}$ and $U_{A2}$ to the double-heater-strip thermoelectric converter (7);

L. reading, by using the nanovoltmeter (8), a thermoelectric potential $E_{A2}$ output by the double-heater-strip thermoelectric converter (7);

M. measuring, by using the high-precision digital sampling system (10), a relative error $\Delta_2$ between the low-frequency voltage signal $U_{A1}$ and the AC quantum voltage signal $U_S$;

N. performing AC/DC conversion to obtain a valid value $U_1$ of an ultralow-frequency voltage signal;

O. controlling, by the upper computer (11), the third switch (6) to perform switching so as to connect a $U_{A2}$ branch to the channel A of the high-precision digital sampling system (10), repeating steps B to M, and performing AC/DC conversion to obtain a valid value $U_2$ of the ultralow-frequency voltage signal; and P. calculating a relative error between an AC/DC conversion result of an ultralow-frequency voltage and the AC quantum voltage.

4. The method for verifying AC/DC conversion of an ultralow-frequency voltage based on the system for verifying AC/DC conversion of an ultralow-frequency voltage based on a quantum technology according to claim 3, wherein in step N, the valid value $U_1$, obtained through AC/DC conversion, of the ultralow-frequency voltage signal is represented as:

$$U_1 = \frac{(U_{D+} - U_{D-})}{2} \times \left[1 + \frac{E_{A1} + E_{A2} - (E_{D+} + E_{D-})}{2(E_{D+} + E_{D-})}\right] \quad (1)$$

one low-frequency signal $U_{A1}$ output by the low-frequency signal source (2) is represented as:

$$U_{A1} = U_S \times \left[1 + \frac{\Delta_1 + \Delta_2}{2}\right] \quad (2)$$

in step O, the valid value $U_2$, obtained through AC/DC conversion, of the ultralow-frequency voltage signal is represented as:

$$U_2 = \frac{(U_{D+} - U_{D-})}{2} \times \left[1 + \frac{E_{A1} + E_{A2} - (E_{D+} + E_{D-})}{2(E_{D+} + E_{D-})}\right]; \quad (3)$$

and the other low-frequency signal $U_{A2}$ output by the low-frequency signal source (2) is represented as:

$$U_{A2} = U_S \times \left[1 + \frac{\Delta_1 + \Delta_2}{2}\right]. \quad (4)$$

5. The method for verifying AC/DC conversion of an ultralow-frequency voltage based on the system for verifying AC/DC conversion of an ultralow-frequency voltage based on a quantum technology according to claim 3, wherein in step P, $$U_- = \frac{U_1 + U_2}{2} \text{ and } U_A = \frac{U_{A1} + U_{A2}}{2}$$

are defined, such that the relative error between the AC/DC conversion result of the ultralow-frequency voltage and the AC quantum voltage may be represented as:

$$\Delta = \frac{U_- - U_A}{U_A}. \quad (5)$$

6. A method for verifying AC/DC conversion of an ultralow-frequency voltage based on the system for verifying AC/DC conversion of an ultralow-frequency voltage based on a quantum technology according to claim 1, wherein the method comprises the following steps:

A. controlling, by the upper computer (11), the third switch (6) to perform switching so as to connect a $U_{A1}$ branch to the channel A of the high-precision digital sampling system (10);

B. controlling, by the upper computer (11), the quantum voltage generation system (1) to output an AC quantum voltage signal $U_S$ that is input to the channel B of the high-precision digital sampling system (10) by using the follower (3), and controlling the low-frequency signal source (2) to output two equal-amplitude and orthogonal low-frequency voltage signals $U_{A1}$ and $U_{A2}$, wherein nominal values of $U_{A1}$, $U_{A2}$, and $U_S$ are equal;

C. controlling, by the upper computer (11), the first switch (4) and the second switch (5) to perform switching, so as to input the low-frequency voltage signals $U_{A1}$ and $U_{A2}$ to the double-heater-strip thermoelectric converter (7);

D. reading, by using the nanovoltmeter (8), a thermoelectric potential $E_{A1}$ output by the double-heater-strip thermoelectric converter (7);

E. measuring, by using the high-precision digital sampling system (10), a relative error $\Delta_1$ between the low-frequency voltage signal $U_{A1}$ and the AC quantum voltage signal $U_S$;

F. controlling, by the upper computer (11), the quantum voltage generation system (1) to output a positive DC quantum voltage signal $U_{D+}$, wherein a nominal value of $U_{D+}$ is equal to that of the AC quantum voltage signal $U_S$;

G. controlling, by the upper computer (11), the first switch (4) and the second switch (5) to perform switching, so as to input the positive DC quantum voltage signal $U_{D+}$ to the double-heater-strip thermoelectric converter (7);

H. reading, by using the nanovoltmeter (8), a thermoelectric potential $E_{D+}$ output by the double-heater-strip thermoelectric converter (7);

I. controlling, by the upper computer (11), the quantum voltage generation system (1) to output a negative DC quantum voltage signal $U_{D-}$, wherein an amplitude of $U_{D-}$ is equal to that of $U_{D+}$;

J. reading, by using the nanovoltmeter (8), a thermoelectric potential $E_{D-}$ output by the double-heater-strip thermoelectric converter (7);

K. controlling, by the upper computer (11), the quantum voltage generation system (1) to output again the AC quantum voltage signal $U_S$ that is input to the channel B of the high-precision digital sampling system (10) by using the follower (3), and controlling the first switch (4) and the second switch (5) to perform switching, so as to input again the low-frequency voltage signals $U_{A1}$ and $U_{A2}$ to the double-heater-strip thermoelectric converter (7);

L. reading, by using the nanovoltmeter (8), a thermoelectric potential $E_{A2}$ output by the double-heater-strip thermoelectric converter (7);

M. measuring, by using the high-precision digital sampling system (10), a relative error $\Delta_2$ between the low-frequency voltage signal $U_{A1}$ and the AC quantum voltage signal $U_S$;

N. performing AC/DC conversion to obtain a valid value $U_1$ of an ultralow-frequency voltage signal;

O. controlling, by the upper computer (11), the third switch (6) to perform switching so as to connect a $U_{A2}$ branch to the channel A of the high-precision digital sampling system (10), repeating steps B to M, and performing AC/DC conversion to obtain a valid value $U_2$ of the ultralow-frequency voltage signal; and P. calculating a relative error between an AC/DC conversion result of an ultralow-frequency voltage and the AC quantum voltage.

7. The method for verifying AC/DC conversion of an ultralow-frequency voltage based on the system for verifying AC/DC conversion of an ultralow-frequency voltage based on a quantum technology according to claim 6, wherein in step N, the valid value $U_1$, obtained through AC/DC conversion, of the ultralow-frequency voltage signal is represented as:

$$U_1 = \frac{(U_{D+} - U_{D-})}{2} \times \left[1 + \frac{E_{A1} + E_{A2} - (E_{D+} + E_{D-})}{2(E_{D+} + E_{D-})}\right] \quad (1)$$

one low-frequency signal $U_{A1}$ output by the low-frequency signal source (2) is represented as:

$$U_{A1} = U_S \times \left[1 + \frac{\Delta_1 + \Delta_2}{2}\right] \quad (2)$$

in step O, the valid value $U_2$, obtained through AC/DC conversion, of the ultralow-frequency voltage signal is represented as:

$$U_2 = \frac{(U_{D+} - U_{D-})}{2} \times \left[1 + \frac{E_{A1} + E_{A2} - (E_{D+} + E_{D-})}{2(E_{D+} + E_{D-})}\right]; \quad (3)$$

and the other low-frequency signal $U_{A2}$ output by the low-frequency signal source (2) is represented as:

$$U_{A2} = U_S \times \left[1 + \frac{\Delta_1 + \Delta_2}{2}\right]. \quad (4)$$

8. The method for verifying AC/DC conversion of an ultralow-frequency voltage based on the system for verifying AC/DC conversion of an ultralow-frequency voltage based on a quantum technology according to claim 4, wherein in step P, $$U_- = \frac{U_1 + U_2}{2} \text{ and } U_A = \frac{U_{A1} + U_{A2}}{2}$$

are defined, such that the relative error between the AC/DC conversion result of the ultralow-frequency voltage and the AC quantum voltage may be represented as:

$$\Delta = \frac{U_- - U_A}{U_A}. \quad (5)$$

* * * * *